United States Patent
Yoon et al.

(10) Patent No.: US 10,025,663 B2
(45) Date of Patent: Jul. 17, 2018

(54) LOCAL CHECKPOINTING USING A MULTI-LEVEL CELL

(75) Inventors: Doe Hyun Yoon, San Jose, CA (US);
Robert Schreiber, Palo Alto, CA (US);
Paolo Faraboschi, Barcelona (ES);
Jichuan Chang, Sunnyvale, CA (US);
Naveen Muralimanohar, Santa Clara, CA (US); Parthasarathy Ranganathan, San Jose, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 167 days.

(21) Appl. No.: 14/374,817

(22) PCT Filed: Apr. 27, 2012

(86) PCT No.: PCT/US2012/035485
§ 371 (c)(1),
(2), (4) Date: Jul. 25, 2014

(87) PCT Pub. No.: WO2013/162598
PCT Pub. Date: Oct. 31, 2013

(65) Prior Publication Data
US 2014/0351495 A1  Nov. 27, 2014

(51) Int. Cl.
*G06F 12/00* (2006.01)
*G06F 11/10* (2006.01)
(Continued)

(52) U.S. Cl.
CPC .......... *G06F 11/1072* (2013.01); *G06F 11/08* (2013.01); *G06F 11/141* (2013.01);
(Continued)

(58) Field of Classification Search
None
See application file for complete search history.

(56) References Cited

U.S. PATENT DOCUMENTS

| 5,410,685 A | 4/1995 | Banda et al. |
| 6,718,435 B2 | 4/2004 | Riedle |

(Continued)

FOREIGN PATENT DOCUMENTS

| CN | 100547565 | 10/2009 |
| CN | 102184141 | 9/2011 |

(Continued)

OTHER PUBLICATIONS

Dong, Xiangyu et al., Leveraging 3D PCRAM technologies to reduce checkpoint overhead for future exascale systems, SC '09 Proceedings of the Conference on High Performance Computing Networking, Storage and Analysis Article No. 57.*

(Continued)

*Primary Examiner* — Prasith Thammavong
*Assistant Examiner* — Jason W Blust
(74) *Attorney, Agent, or Firm* — Hanley Flight & Zimmerman, LLC

(57) ABSTRACT

Local checkpointing using a multi-level call is described herein. An example method includes storing a first datum in a first level of a multi-level cell. A second datum is stored in a second level of the multi-level cell, the second datum representing a checkpoint of the first datum. The first datum is copied from the first level to the second level of the multi-level cell to create the checkpoint.

15 Claims, 9 Drawing Sheets

(51) Int. Cl.
*G06F 11/08* (2006.01)
*G11C 11/56* (2006.01)
*G11C 13/00* (2006.01)
*G06F 11/14* (2006.01)
*G06F 12/02* (2006.01)
*G11C 29/44* (2006.01)

(52) U.S. Cl.
CPC ...... *G06F 11/1407* (2013.01); *G06F 12/0238* (2013.01); *G06F 12/0246* (2013.01); *G11C 11/56* (2013.01); *G11C 11/5678* (2013.01); *G11C 11/5685* (2013.01); *G11C 13/0059* (2013.01); *G11C 29/44* (2013.01); *G06F 2212/1016* (2013.01); *G06F 2212/1028* (2013.01); *G06F 2212/7207* (2013.01); *G06F 2212/7209* (2013.01); *G11C 2013/0076* (2013.01); *G11C 2029/4402* (2013.01); *G11C 2211/5641* (2013.01); *Y02D 10/13* (2018.01)

(56) References Cited

U.S. PATENT DOCUMENTS

| | | | |
|---|---|---|---|
| 7,818,610 | B2 | 10/2010 | Rogers et al. |
| 7,840,768 | B2 | 11/2010 | Stiffler et al. |
| 7,924,587 | B2 | 4/2011 | Perlmutter et al. |
| 8,050,903 | B1 | 11/2011 | Bosshart et al. |
| 2009/0150599 | A1 | 6/2009 | Bennett |
| 2009/0213653 | A1 | 8/2009 | Perlmutter et al. |
| 2009/0265504 | A1* | 10/2009 | Klein ............ G06F 11/1438 711/100 |
| 2010/0235715 | A1* | 9/2010 | Thatcher ............ G11C 16/10 711/154 |
| 2012/0079174 | A1 | 3/2012 | Nellans et al. |
| 2012/0159100 | A1* | 6/2012 | Martinsen ............ G06F 3/0607 711/162 |
| 2012/0243311 | A1* | 9/2012 | Chen ............ G11C 7/1006 365/171 |

FOREIGN PATENT DOCUMENTS

| | | |
|---|---|---|
| EP | 2820548 | 1/2015 |
| JP | 2009076116 A | 7/2009 |
| KR | 1011069770 B1 | 1/2012 |
| KR | 1020100091227 A | 12/2015 |
| WO | 2006065575 A1 | 6/2006 |
| WO | WO-2012050934 | 4/2012 |
| WO | 2013130106 A1 | 9/2013 |

OTHER PUBLICATIONS

Bailey, K. et al., Operating System Implications of Fast, Cheap, Non-Volatile Memory, 2011, University of Washington Dept of Computer Science & Engineering—5 pages.

McLaren, M., Memristors and New Memory Hierarchies, 2010, Exascale Computing Lab, HP Labs—17 pages.

PCT Search Report—Application No. PCT/US2012/035485 dated Dec. 27, 2012—8 pages.

* cited by examiner

LOCAL CHECKPOINTING USING A MULTI-LEVEL CELL

STATEMENT OF GOVERNMENT INTEREST

This invention has been made with government support under Contract No. DE-SC0005026, awarded by The Department of Energy. The government has certain rights in the invention.

BACKGROUND

High performance computing (HPC) systems are topically used for performing calculations of complex mathematical and/or scientific information. Such calculations may include simulations of chemical interactions, signal analysis, simulations of structural analysis, etc. Due to their complexities, it is often significantly time consuming (e.g., hours, days, weeks, etc.) for HPC systems to complete these calculations. Errors such as hardware failures, application bugs, memory corruptions, system faults, etc. can occur during the calculations and leave computed data in a corrupted and/or inconsistent state. When such errors occur, HPC systems restart the calculations, which could significantly increase the processing time to complete the calculations.

To reduce processing times for recalculations, checkpoints are used to store versions of calculated data at various points during the calculations. When an error occurs, the computing system restores data from the most recent checkpoint and resumes the calculation from the restored checkpoint. In this manner, checkpoints can be used to decrease processing times of calculations by keeping a system from having to completely restart a calculation.

DETAILED DESCRIPTION

Figure 1:
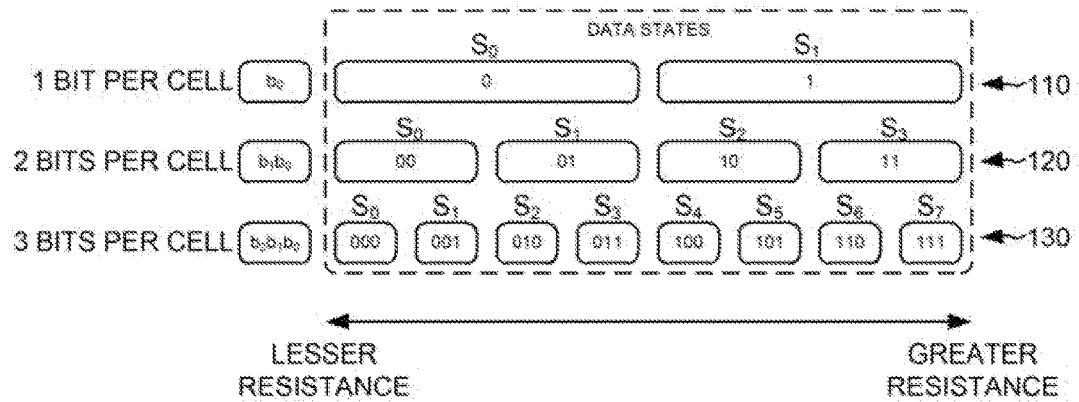
FIG. 1 depicts example multi-level cell (MLC) non-volatile random access memory (NVRAM) configurations.

Example methods, apparatus, and articles of manufacture disclosed herein enable implementing versioned memory using multi-level cell (MLC) non-volatile random access memory (NVRAM). To implement versioned memory, examples disclosed herein utilize a multi-level cell (MLC) to encode both working datum and one or more data checkpoint(s). The example working datum is stored in a first bit of the multi-level cell and the example checkpoint datum is stored in a second bit of the multi-level cell. Example versioned memory techniques disclosed herein can be used to implement checkpointing that is relatively faster and more energy efficient than known checkpoint techniques.

Recent NVRAM memory technologies (e.g., phase-change memory (PCRAM), memristors, etc.) have higher memory densities than legacy memory technologies. Such higher density NVRAM memory technologies are expected to be used in newer computing systems. However, designers, engineers, and users face risks of NVRAM corruption resulting from errors such as, for example, memory leaks, system faults, application bugs, etc. As such, examples disclosed herein may be used to restore the data in the NVRAM to a stable state to eliminate or substantially decrease the risk of corruption.

Known systems use multi-versioned data structures, checkpoint logging procedures, etc. to enable recovery from errors. However, using multi-versioned data structures in such previous systems required specifically designed software applications that can access those multi-versioned data structures. Thus, use of these known data structures is limited to computing systems having such specifically designed software applications. In some known systems, checkpoint togging procedures rely on the ability to copy memory to a separate location to create a checkpoint. However, copying memory may be overly time consuming, and may be prone to errors as many memory operations are used to create the checkpoint. To overcome errors, checkpoint logging systems create logs of copied data to enable recovery from an error during the checkpointing process. However, these mechanisms incur considerable overhead of performance and power.

Example methods, apparatus, and articles of manufacture disclosed herein enable checkpointing in high performance computing (HPC) systems. Examples disclosed herein implement example checkpoint operations by storing checkpoint datum in an additional layer of the same multi-layer cell in which the working datum is stored. By storing checkpoint data in the same cell, the data is more easily addressable and memory write operations are relatively faster because the data being checkpointed is not transmitted to a separate memory location (e.g., a remote checkpoint server, a separate memory device in the same computing system, a separate memory location of the same memory device of the computing system, etc.).

Examples disclosed herein use multi-level cell (MLC) non-volatile random access memory (NVRAM) to store information. MLC NVRAM uses a physical property value of a memory cell to indicate, encode, or represent the stored information. A physical property value refers to a measureable property or characteristic of a memory cell. In examples disclosed herein, the physical property value is representative of a resistance value. However, any other suitable type of property may be used corresponding to the memory technology employed such as, for example, a capacitance value, an atomic spin value, etc. As such, any other type of memory may additionally or alternatively be used in connection with examples disclosed herein.

Examples disclosed herein use multi-level cell (MLC) non-volatile random access memory (NVRAM) to implement checkpointing. When a multi-level cell is divided into smaller resistance ranges, additional bits of data may be stored in the cell. For example, a multi-level cell having four resistance ranges may store two bits of data. In such an example, a first resistance range encodes a first data state of zero-zero; a second resistance range encodes a second data state of zero-one; a third resistance range encodes a third data state of one-zero; and a fourth resistance range encodes a fourth data state of one-one. When using a multi-level cell, transitioning between different resistance ranges consumes time and energy. Transitioning to a greater resistance range (e.g., a resistance range encoded by a higher resistance) uses relatively more time and energy than transitioning to a lesser resistance range (e.g., a resistance range encoded by a lower resistance). In some examples, the resistance range encodings are altered such that during a checkpointing operation, memory operations transition from a greater resistance range to a lesser resistance range, thereby reducing the time and energy used to create the checkpoint.

FIG. 1 deplete example multi-level cell (MLC) non-volatile random access memory (NVRAM) configurations. A first example NVRAM cell 110 stores one bit per cell (e.g., a single-level NVRAM cell having bit $b_0$), using a first range of resistance (e.g., low resistance values) to represent a Boolean '0' (e.g., state $S_0$) and a second range of resistance (e.g., high resistance values) to represent a Boolean '1' (e.g., state $S_1$). By dividing NVRAM cells into smaller resistance ranges as shown by example MLC NVRAM cells 120 and 130, more information may be stored in an NVRAM cell, thereby, creating a higher-density memory. An example NVRAM cell 120 stores two bits per cell (e.g., four ranges of resistance to represent bits $b_1$ and $b_0$), and an example NVRAM cell 130 uses three bits per cell (e.g., eight ranges of resistance to represent bits $b_2$, $b_1$, and $b_0$). In the illustrated example of FIG. 1, each MLC NVRAM cell 120 and 130 stores multiple bits by using a finer-grained quantization of the cell resistance. Thus, MLC NVRAM is used to increase memory density, as more bits are stored in the same number of NVRAM cells.

Unlike other types of memory (e.g., dynamic random access memory (DRAM)), NVRAM has asymmetric operational characteristics. Writing to NVRAM is more time and energy consuming than reading from NVRAM. Further, read and write operations use more memory cycles when using MLC NVRAM as compared to a single-level cell (e.g., the first example NVRAM cell 110). In MLC NVRAM, reading uses multiple steps to accurately resolve the resistance level stored in the NVRAM cell. In addition, reading the most-significant bit of an MLC (e.g., the calls 120 and 130) takes less time because the read circuitry need not determine cell resistance with the precision needed to read the least-significant bit of the MLC. Similarly, writing to a MLC NVRAM cell takes longer than a single-level cell because writing uses a serial read operation to verify that the proper value has been written to the NVRAM cell. As such, restoring corrupted data in an MLC NVRAM using known techniques can be overly time and energy consuming.

Figure 2:
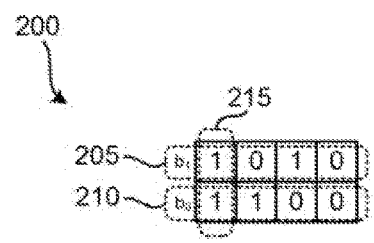
FIG. 2 is a block diagram of an example memory block using the MLC NVRAM of FIG. 1.

FIG. 2 is an example checkpointing configuration shown with an example memory block 200 having four multi-level memory cells, one of which is shown at reference numeral 215. In other examples, the memory block 200 may include any dumber of multilevel cells. In the illustrated example, the cells of the memory block 200 are implemented using a two-bit per cell MLC NVRAM (e.g., the NVRAM cell 120 of FIG. 1) having a first level 205 (e.g., a most significant bit (MSB)) and a second level 210 (e.g., a least significant bit (LSB)). In some examples, data stored in the first level 205 represents working data, and data stored in the second level 210 represents checkpoint data. In some examples, working data is copied from the first level 205 to the second level 210 as part of a checkpointing operation.

As used herein, a checkpoint refers to a memory state at a particular point in time at which memory contents are stored or persisted in memory as checkpoint, data for subsequent use to recover from errors, failures, and/or corruption. In the illustrated example, a checkpoint is created from time-to-time (e.g., periodically or aperiodically) based on a checkpointing instruction from an application performing calculations using the memory block 200 to indicate when a new checkpoint is to be stored. Additionally or alternatively, any other periodic and/or aperiodic approach to triggering creation of a checkpoint may be used. For example, a check-point may be created after a set number of read and/or write operations (e.g., after one read and/or write operation, after one hundred read and/or write operations, after one billion read and/or write operations, etc.), may be created after an amount of time (e.g., one minute, fifteen minutes, one hour, etc.), and/or may be created at any other suitable time.

Although the multi-level cell 215 of the illustrated example is shown as a two-bit per cell MLC, examples disclosed herein may be implemented in connection win MLCs having more than two hits per cell (e.g., three bits per cell, four bits per cell, etc.). In some examples, additional bits per cell are used to store additional checkpoints. For example, the first layer 206 may store working datum, the second layer 210 may store first checkpoint datum, and a third layer may store second checkpoint datum. In some examples, bits are combined into multi-bit groupings. For example, a MLC having four bits per cell may be grouped into two two-bit groups, thereby enabling two bits of working data to be stored in one two-bit group as well as one set of checkpoint data in the second two-bit group.

Figure 3:
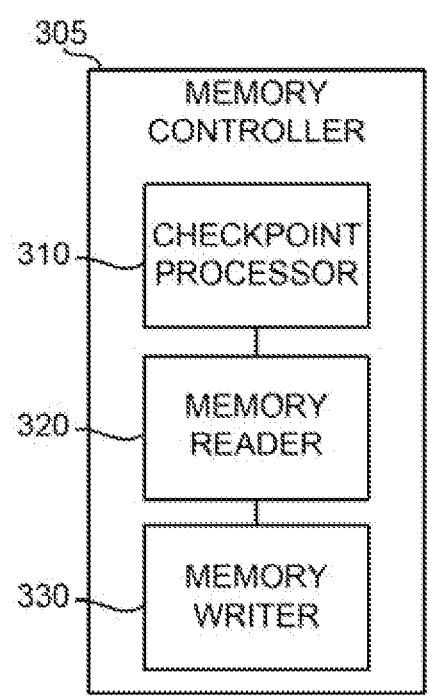
FIG. 3 is a block diagram of an example memory controller that may be used to implement local checkpointing using the example memory block of FIG. 2.

FIG. 3 is a block diagram of an example memory controller 305 that may be used to implement versioned memory using the example memory block 200 of FIG. 2. The memory controller 305 of the illustrated example of FIG. 1 includes a checkpoint processor 310, a memory reader 320, and a memory writer 330.

The example checkpoint processor 310 of FIG. 3 is implemented by a processor executing instructions, but it could additionally or alternatively be implemented by an application specific integrated circuit(s) (ASIC(s)), programmable logic device(s) (PLP(s)) and/or field programmable logic device(s) (FPLD(s)), and/or other circuitry. The checkpoint processor 310 of the illustrated example creates a checkpoint based on an instruction to create a checkpoint.

The example memory reader 320 of FIG. 3 is implemented by a processor executing instructions, but could additionally or alternatively be implemented by an ASIC, DSP, FPGA, and/or other circuitry. In some examples, the example memory reader 320 is implemented by the same processor as the checkpoint processor 310. In the illustrated example, the example memory reader 320 reads data from a layer of the memory cell 215 to provide the data in response to a read request and/or to use the data during a checkpoint, operation. In some examples, the memory reader 320 reads data from a working layer of the memory cell 215 in response to a read request. In some examples, the memory reader 320 does not read data from layers other than the working layer in response to the read request. Not reading data from layers other than the working layer in response to the read request enables the memory reader 320 to more quickly read data stored in the working layer of the memory cell.

The example memory writer 330 of FIG. 3 is implemented by a processor executing instructions, but could additionally or alternatively be implemented by an ASIC, DSP, FPGA, and/or other circuitry. In some examples, the example memory writer 330 is implemented by the same processor as the memory reader 320 and/or the checkpoint processor 310. In the illustrated example, the example memory writer 330 writes data to a layer of the memory cell 215 in response to a write request and/or during a checkpoint operation.

Figure 4:
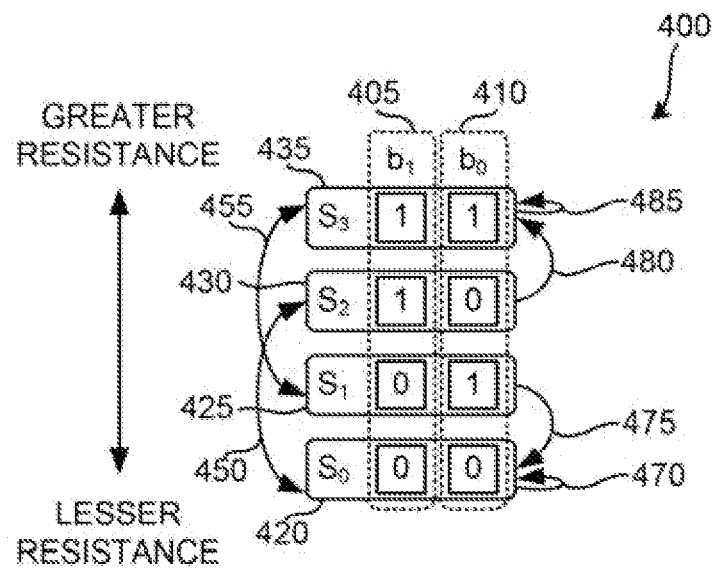
FIG. 4 is a block diagram of a multi-level cell having two bits per cell.

FIG. 4 is a block diagram of a multi-level cell 400 having two bits per cell in the illustrated-example, the two bits are represented as $b_1$ 405 and $b_0$ 410. The example multi-level cell 400 includes four data states encoded by changing the resistance of the multi-level cell 400. A first state $S_0$ 420 represents binary data of zero-zero and is encoded by a first resistance. A second state $S_1$ 425 represents binary data of zero-one and is encoded by a second resistance. The second resistance is greater than the first resistance. A third state $S_2$ 430 represents binary data of one-zero and is encoded by a third resistance. The third resistance is greater than the first resistance and is greater than the second resistance. A fourth state $S_3$ 435 represents binary data of one-one and is-encoded by a fourth resistance. The fourth resistance is greater than each of the first resistance, the second resistance, and the third resistance. As such, the resistance encodings are ordered such that they represent the standard ordering of incremented binary numbers.

In the illustrated example, a working bit is represented by $b_1$ 405. A checkpoint bit is represented by $b_0$ 410. During normal operation, the checkpoint bit is not modified. As such, the first state $S_0$ 420 and the third state $S_2$ 430 with transition between each other when contents of the working bit $b_1$ 405 are modified and the checkpoint datum in the checkpoint bit $b_0$ 410 is zero. A first working data state transition 450 modifies the working bit 405 between one (as in the third state $S_2$ 430) and zero (as in the first state $S_0$ 420). The checkpoint datum remains as zero during the first working data state transition 450. Additionally, the second state $S_1$ 425 and the fourth state $S_3$ 435 will transition between each other when contents of the working bit $b_1$ 405 are modified and the checkpoint datum in the checkpoint bit $b_0$ 410 is one. A second working data state transition 455 modifies the working bit 405 between one (as in the fourth state $S_3$ 435) and zero (as in the second state $S_1$ 425). The checkpoint datum remains one during the second working data state transition 455.

During a checkpoint operation, data stored in the working bit $b_1$ 405 is copied to the checkpoint bit $b_0$ 410. A first checkpoint transition 479 represents a state transition that operates to copy the working bit $b_1$ 405 of the first state $S_0$ 420 (a zero) to the checkpoint bit $b_0$ 410. In the illustrated example, the first checkpoint transition 470 does not transition the multi-level cell 400 to a different state the multi-level cell 400 remains in the first state $S_0$ 420) because the value stored in the working bit $b_1$ 405 (a zero) is already stored in the checkpoint bit $b_0$ 410. A second checkpoint transition 475 represents a state transition that operates to copy the working bit $b_1$ 405 of the second state $S_1$ 425 (a zero) to the checkpoint bit $b_0$ 410. In the illustrated example, the second checkpoint transition 475 transitions the multi-level cell 400 from the second state $S_1$ 425 to the first state $S_0$ 420. As such, the resistance encoded by the multi-level cell 400 is decreased during the second checkpoint transition 475. A third checkpoint transition 480 represents a state transition that operates to copy the working bit $b_1$ 405 of the third state $S_2$ 430 (a one) to the checkpoint bit $b_0$ 410. In the illustrated example, the third checkpoint transition 480 transitions the multi-level cell 400 from the third state $S_2$ 430 to the fourth state $S_3$ 435. As such, the resistance encoded by the multi-level cell 400 is increased during the third checkpoint transition 480. A fourth checkpoint transition 485 represents a state transition that operates to copy the working bit $b_1$ 405 of the fourth state $S_3$ 435 (a one) to the checkpoint bit $b_0$ 410. In the illustrated example, the fourth checkpoint transition 485 does not transition the multi-level cell 400 to a different state (e.g., the multilevel cell 400 remains in the fourth state $S_3$ 435) because the value stored in the working bit $b_1$ 405 (a one) is already stored in the checkpoint bit $b_0$ 410.

Figure 5:
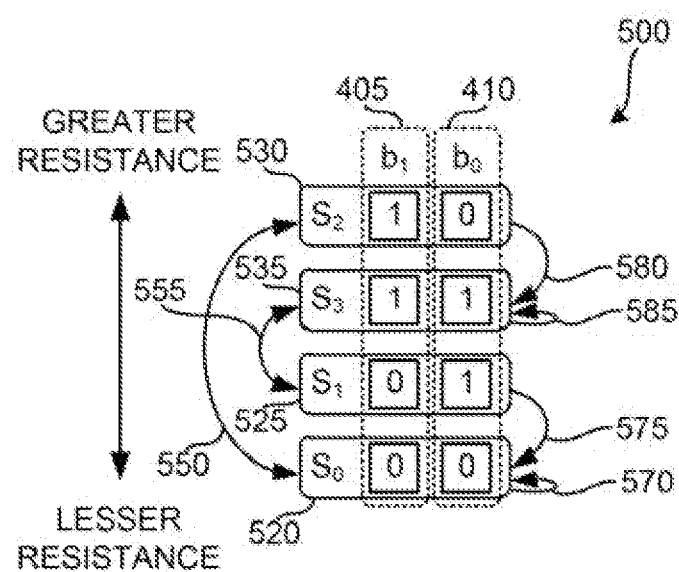
FIG. 5 is a block diagram of an alternative multi-level cell having two bits per cell.

FIG. 5 is a block diagram of an alternative multi-level cell 500 having two bits per cell. In the illustrated example, the state encodings ($S_0$, $S_1$, $S_2$, and $S_3$) are ordered such that state $S_0$ corresponds to the least resistance and state $S_2$ corresponds to the greatest resistance. As explained above, transitioning between different resistance ranges of the multi-level cell 500 consumes time and energy. Transitioning to a greater resistance range (e.g., a resistance range encoded by a higher resistance) uses relatively more time and energy than transitioning to a lesser resistance range (e.g., a resistance range encoded by a lower resistance). As such, the resistance encodings of FIG. 5 are altered such that during a checkpointing operation, memory operations will transition from a greater resistance range to a lesser resistance range, thereby decreasing the time and energy used to create the checkpoint.

Figure 6:
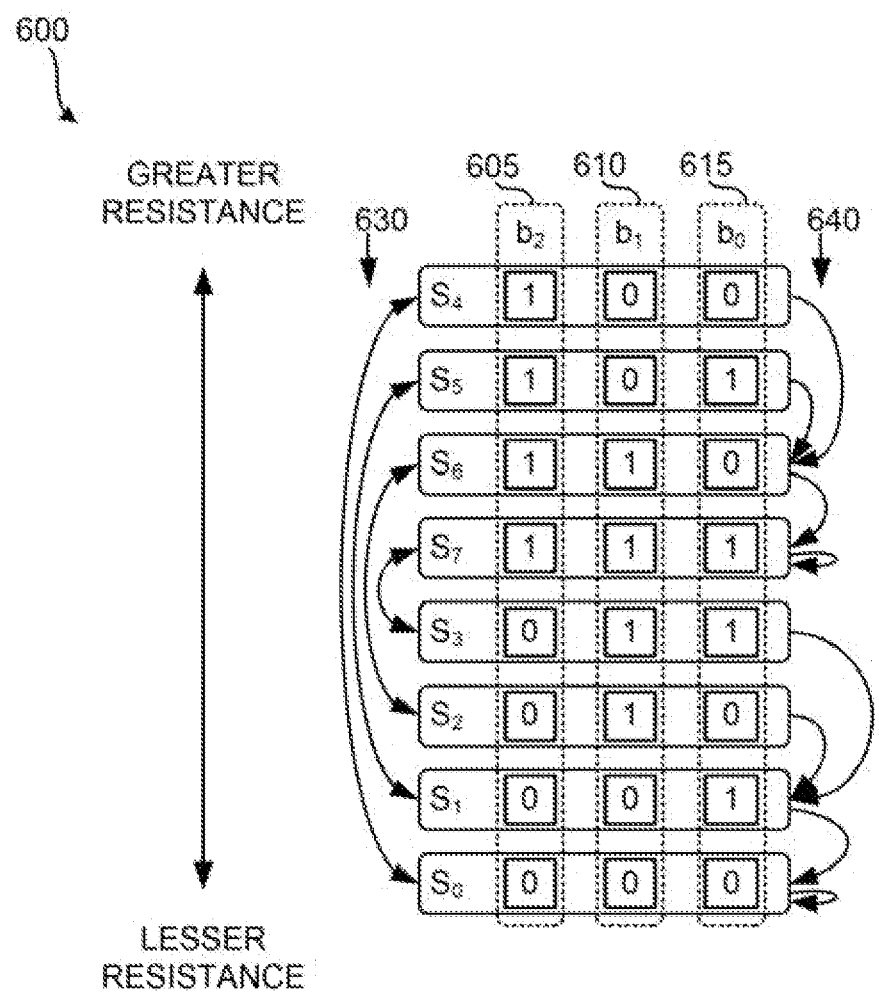
FIG. 6 is a block diagram of a multi-level cell having three bits per cell.

In the illustrated examples, two rules are used for the state encoding of the multilevel cell 500 of FIG. 6. First, the working bit(s) $b_1$ 405 are grouped together based on the stored value(s). Grouping the working bit(s) enables simple and fast reads of the working bit(s) $b_1$ 405 because the resistance levels of the multi-level cell 500 need only be sufficiently distinguishable from one another to determine the working bit(s) $b_1$ 405 (e.g., instead of needing to distinguish more resistance levels from one another to determine the working bit(s) $b_1$ 405 and the checkpoint bit(s) $b_0$ 410). Second, the checkpoint bit(s) $b_0$ 410 are encoded such that checkpointing decreases the resistance of the multi-level cell 500. Thus, compared to the example of FIG. 4, the illustrated example of FIG. 5 reverses the ordering of the resistance encodings for a third state $S_2$ 530 and the fourth state $S_3$ 535.

In the illustrated example of FIG. 5, a first state $S_0$ 520 represents binary data of zero-zero and is encoded by a first resistance. A second state $S_1$ 525 represents binary data of zero-one and is encoded by a second resistance. The second resistance is greater than the first resistance. A third state $S_2$ 530 represents binary data of one-zero and is encoded by a third resistance. The third resistance is greater than the first resistance and is greater than the second resistance. A fourth state $S_3$ 535 represents binary data of one-one and is encoded by a fourth resistance. The fourth resistance is greater than the first resistance and the second resistance, but is less than the third resistance.

In the illustrated example of FIG. 5, the first state $S_0$ 520 and the third state $S_2$ 530 wilt transition between each other during working operation when the contents of the working bit $b_1$ 405 is modified and the checkpoint datum in checkpoint bit $b_0$ 410 is zero. A first working data state transition 550 modifies the working bit 405 between one (as in the third state $S_2$ 530) and zero (as in the first state $S_0$ 520). The checkpoint datum in checkpoint bit $b_0$ 410 remains zero during the first working data state transition 550. In the illustrated example, the first working data state transition 550 of FIG. 5 consumes more time and energy than the first working data state transition 450 of FIG. 4. Additionally, the second state $S_1$ 525 end the fourth state $S_3$ 535 will transition between each other during working operation when the contents of the working bit $b_1$ 405 is modified and the checkpoint datum in checkpoint bit $b_0$ 410 is one. A second working data state transition 555 modifies the working bit $b_1$ 405 between one (as in the fourth state $S_3$ 535) and zero (as in the second state $S_1$ 525). The checkpoint datum in checkpoint bit $b_0$ 410 remains one during the second working data state transition 555.

In the illustrated example, the working data state transitions 450 and 455, and the checkpoint transitions 470, 475, 480, and 480 of FIG. 4, as a whole, consume more time and energy than the working data state transitions 550 and 555, and the checkpoint transitions 570, 575, 580, and 585 of FIG. 5. During a checkpoint operation, data stored in the working bit $b_1$ 405 is copied to the checkpoint bit $b_0$ 410. A first checkpoint transition 570 represents a state transition that operates to copy the working bit $b_1$ 405 of the first state $S_0$ 520 (a zero) to the checkpoint bit $b_0$ 410. In the illustrated example, the first checkpoint transition 570 does not transition the multi-level cell 500 to a different state (e.g., the multi-level cell 500 remains in the first state $S_0$ 520) because the value stored in the working bit $b_1$ 405 (a zero) is already stored in the checkpoint bit $b_0$ 410.

A second checkpoint transition 575 represents a state transition that operates to copy the working bit $b_1$ 405 of the second state $S_1$ 525 (a zero) to the checkpoint bit $b_0$ 410. In the illustrated example, the second checkpoint transition 580 transitions the multilevel cell 500 from the second state $S_1$ 525 to the first state $S_0$ 520. As such, the resistance encoded by the multilevel cell 400 is decreased during the second checkpoint transition 575.

A third checkpoint transition 580 represents a state transition that operates to copy the working bit $b_1$ 405 of the third state $S_2$ 530 (a one) to the checkpoint bit $b_0$ 410. In the illustrated example, the third checkpoint transition 575 transitions the multi-level cell 500 from the third state $S_3$ 530 to the fourth state $S_3$ 535. As such, the resistance encoded by the multi-level cell 500 is decreased during the third checkpoint transition 580, When compared to the illustrated example of FIG. 4, the resistance encoded by the multi-level cell 500 of FIG. 5 is decreased during the third checkpoint transition 580, rather than increased (as in the third checkpoint transition 480 of FIG. 4). Because transitions that reduce the resistance of a multi-level cell consume less time and energy than transitions that increase the resistance of a multi-level cell, the multi-level cell 500 of the illustrated example of FIG. 5 enables checkpointing operations that, use less time and energy than multilevel cells that use traditional ordering (e.g., the state ordering of FIG. 4) for their binary encoding.

A fourth checkpoint transition 585 represents a state transition that operates to copy the working bit $b_1$ 405 of the fourth state $S_3$ 535 (a one) to the checkpoint bit $b_0$ 410. In the illustrated example, the fourth checkpoint transition 585 does not transition the multi-level cell 500 to a different state (e.g., the multi-level cell 500 remains in the fourth state $S_3$ 535) because the value stored In the working bit $b_1$ 405 (a one) is already stored in the checkpoint bit $b_0$ 410.

FIG. 6 is a block diagram of a multi-level cell 600 having three bits per cell. In the illustrated example, the state encodings ($S_0$, $S_1$, $S_2$, $S_3$, $S_4$, $S_5$, $S_6$, and $S_7$) are ordered such that state $S_0$ corresponds to the least resistance and state $S_4$ corresponds to the greatest resistance. In the illustrated example of FIG. 6, the multi-level cell 600 stores two checkpoint states. The multi-level cell 600 includes a working bit $b_2$ 605, a first checkpoint bit $b_1$ 610, and a second checkpoint bit $b_0$ 615. During working operation, the multilevel cell 600 transitions 630 between various states. For example, working data state transitions 630 transition the multi-level cell 600 between respective ones of the state $S_0$ (representing data of zero-zero-zero) and state $S_4$ (representing data of one-zero-zero), state $S_1$ (representing data of zero-zero-one) and state $S_5$ (representing data of one-zero-one), state $S_2$ (representing data of zero-one-zero) and $S_6$ (representing data of one-one-zero), and $S_3$ (representing data of zero-one-one) and state $S_7$ (representing data of one-one-one) corresponding to the stored checkpoint values in checkpoint hits $b_1$ 610 and $b_0$ 615. During such working state transitions in which the working bit $b_2$ 605 is being modified, the first checkpoint bit $b_1$ 610 and the second checkpoint bit $b_0$ 615 remain unchanged. For example, if stored checkpoint data is zero-one, working state transitions 630 to modify the working bit $b_2$ 605 transition the multilevel cell 600 between states $S_1$ and $S_5$ such that the checkpoint data in the checkpoint bits $b_1$ 610 and $b_0$ 615 remain unchanged.

During checkpoint operations, checkpoint transitions 640 transition the multi-level cell 600 between different ones of the states $S_0$, $S_1$, $S_2$, $S_3$, $S_4$, $S_5$, $S_6$, and $S_7$ so that data stored in the first checkpoint bit. $b_1$ 610 is copied to the second checkpoint bit $b_0$ 615 and data stored in the working bit $b_2$ 605 is copied to the first checkpoint bit $b_1$ 610. During such checkpoint-operations, the multilevel cell 600 transitions from higher resistance encodings to lower resistance encodings. For example, state $S_4$ (representing data of one-zero-zero) transitions to state $S_6$ (representing data of one-one-zero) having a lower resistance encoding that state $S_4$.

Figure 7:
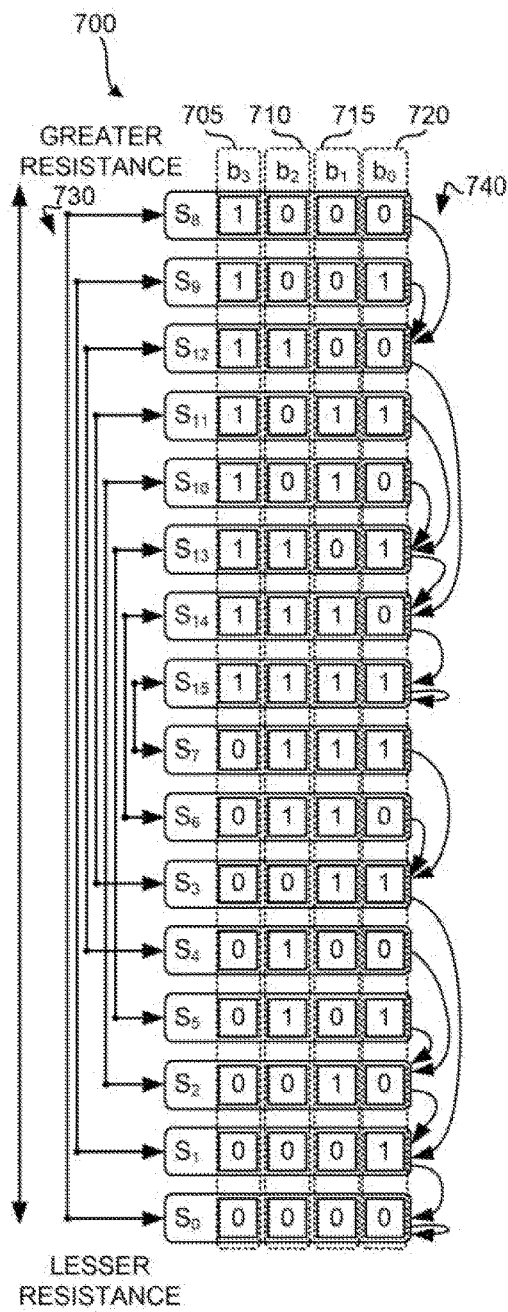
FIG. 7 is a block diagram of a multi-level cell having four bits per cell.

FIG. 7 is a block diagram of a multi-level cell 700 having four bits per cell, in the illustrated example, the state encodings ($S_0$, $S_1$, $S_2$, $S_3$, $S_4$, $S_5$, $S_6$, $S_7$, $S_8$, $S_9$, $S_{10}$, $S_{11}$, $S_{12}$, $S_{13}$, $S_{14}$, and $S_{15}$) are ordered such that state $S_0$ corresponds to the least resistance end state $S_8$ corresponds to the greatest resistance. In the illustrated example of FIG. 7, the multi-level cell 700 stores three checkpoint states. The multi-level cell 700 includes a working bit $b_3$ 705, a first checkpoint bit $b_2$ 710, a second checkpoint bit $b_1$ 715, and a third checkpoint bit $b_0$ 720. Additionally or alternatively, any other number of bits may be used such as, for example, five bits, ten bits, sixteen bits, thirty-two bits, etc. to increase the number of checkpoint states that can be stored. The illustrated example of FIG. 7 shows an example ordering of the state encodings for the multi-level cell 700. However, other orderings for the state encodings may additionally or alternatively be used.

During working operation, working state transitions 730 transition the multi-level cell 700 transitions 730 between respective ones of the illustrated states $S_0$ (representing data of zero-zero-zero-zero), $S_1$ (representing data of zero-zero-zero-one), $S_2$ (representing data of zero-zero-one-zero), $S_3$ (representing data of zero-zero-one-one), $S_4$ (representing data of zero-one-zero-zero), $S_5$ (representing data of zero-one-zero-one), $S_6$ (representing data of zero-one-one-zero), $S_7$ (representing data of zero-one-one-one), $S_8$ (representing data of one-zero-zero-zero), $S_9$ (representing data of one-zero-zero-one), $S_{10}$ (representing data of one-zero-one-zero), $S_{11}$ (representing data of one-zero-one-one), $S_{12}$ (representing data of one-one-zero-zero), $S_{13}$ (representing data of one-one-zero-one), $S_{14}$ (representing data of one-one-one-zero), and $S_{15}$ (representing data of one-one-one-one) corresponding to stored checkpoint values, During such working state transitions, the first checkpoint bit $b_2$ 710, the second checkpoint bit $b_1$ 715, and the third checkpoint bit $b_0$ 720 remain unchanged. For example, if stored checkpoint data is zero-zero-zero, working state transitions 730 to modify the working bit $b_3$ 705 transition the multi-level cell 700 between states $S_0$ and $S_8$ such that the checkpoint data in checkpoint bits $b_2$ 710, $b_1$ 715, and $b_0$ 720 remain unchanged.

During checkpoint operations, checkpoint transitions 740 transition the multi-level cell 700 to a state where data stored in the second checkpoint bit $b_1$ 715 is copied to the third checkpoint bit $b_0$ 720, data stored in the first checkpoint bit $b_2$ 710 is copied to the second checkpoint bit $b_1$ 715, and data stored in the working bit $b_3$ 705 is copied to the first checkpoint bit $b_2$ 710. During such checkpoint operations, the multi-level cell 700 transitions from a higher resistance encoding to a lower resistance encoding. For example, state $S_4$ (representing data of zero-one-zero-zero) transitions to state $S_2$ (representing data of zero-zero-one-zero).

Figure 8:
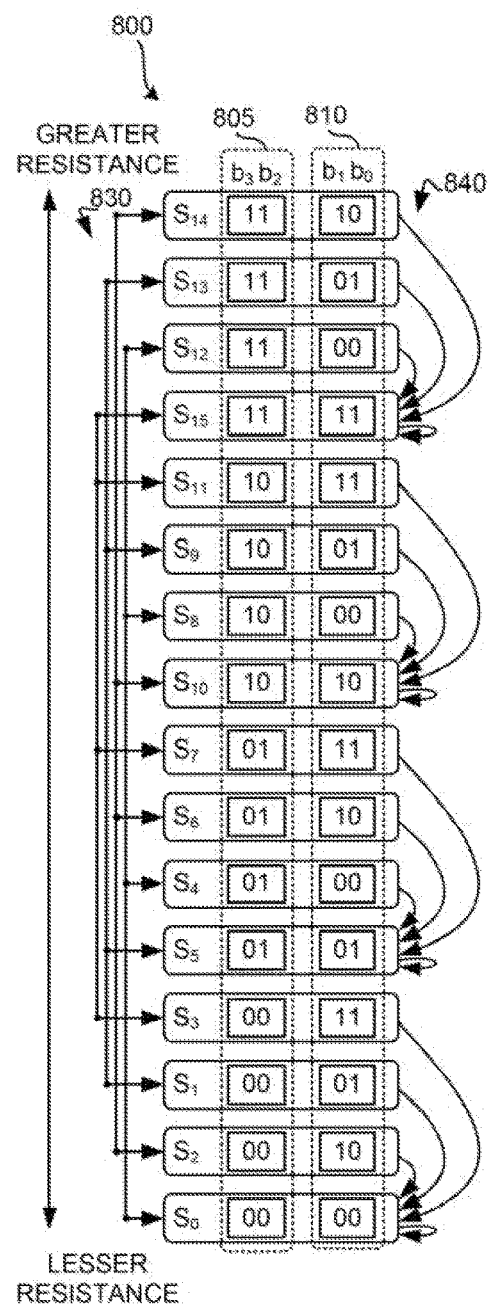
FIG. 8 is a block diagram of a multi-level cell having four bits per cell.

FIG. 8 is a block diagram of a multi-level cell 800 having four bits per cell. In the illustrated example of FIG. 8, multiple bits are grouped to form bit group(s). A working bit group $b_3b_2$ 805 represents two bits and a checkpoint bit group $b_1b_0$ 810 represents two bits. Additionally or alternatively, any other number of bits may be used in a bit group. Further, any number of bit groups may be used. In the illustrated example, the number of bits per cell (e.g., four bits per cell), is evenly divided by the number of bits per bit group (e.g., two bits per bit group). In some examples, the number of bits per cell is not evenly divisible by the number of bits per bit group. In such examples, remaining bits are not used. However, in some examples, the remaining bits are used to, for example, store state information, or other types of information.

The illustrated example of FIG. 8 shows an example ordering of the state encodings for the multi-level cell 800. In the illustrated example, the state encodings ($S_0$, $S_1$, $S_2$, $S_3$, $S_4$, $S_5$, $S_6$, $S_7$, $S_8$, $S_9$, $S_{10}$, $S_{11}$, $S_{12}$, $S_{13}$, $S_{14}$, and $S_{15}$) are ordered such that state $S_0$ corresponds to the least resistance and state $S_{14}$ corresponds to the greatest resistance. As shown in the illustrated example, the encodings having the same values for the working bit group $b_3b_2$ 805 are grouped together. Grouping the state encodings by working bit group $b_3b_2$ 805 enables faster read operations as the resistance levels of the multi-level cell 800 need only be sufficiently distinguishable from one another to determine the value of the working bit group $b_3b_2$ 805. In addition, as shown in the illustrated example, the state encodings are ordered such that within each grouping of state encodings having the same value of the working bit group $b_3b_2$ 805, the checkpoint bit group $b_1b_0$ 810 having the same value as the working bit group $b_3b_2$ 805 is the lowest resistance. Having the checkpoint bit group $b_1b_0$ 810 with the same value as the working bit group $b_3b_2$ 805 as the lowest resistance enables efficient checkpoint operations, as the resistance of the multi-level cell 800 is decreased during the checkpoint operation. Thus, for example, the ordering of the state $S_{14}$, $S_{13}$, and/or $S_{12}$ may be altered.

During working operation, working state transitions 830 transition the multi-level cell 800 between different ones of the states $S_0$ through $S_{15}$. For example, the multi-level cell 800 may transition between state $S_0$, state $S_4$, state $S_8$, and $S_{12}$ based on the data that is written to the working bit group $b_3b_2$ 805. In the illustrated example, values stored in the checkpoint bit group $b_1b_0$ 810 remains the same during working operation.

During checkpoint operations, checkpoint transitions 840 transition the multi-level cell 800 to a state where data stored in the working bit group $b_3b_2$ 805 is copied to the checkpoint bit group $b_1b_0$ 810. As such, the multi-level cell 800 transitions 840 from a higher resistance encoding to a lower resistance encoding. For example, state $S_7$ (representing data of zero-one-one-one) transitions to state $S_5$ (representing data of zero-one-zero-one).

While an example manner of implementing the memory controller 305 has been illustrated in FIG. 3, one or more of the elements, processes, and/or devices illustrated in FIG. 3 may be combined, divided, re-arranged, omitted, eliminated, and/or implemented in any other way. Further, the example checkpoint processor 310, the example memory reader 320, the example memory writer 330, and/or, more generally, the example memory controller 305 of FIG. 3 may be implemented by hardware, software, firmware and/or any combination of hardware, software and/or firmware. Thus, for example, any of the example checkpoint processor 310, the example memory reader 320, the example memory writer 330 and/or, more generally, the example memory controller 305 of FIG. 3 could be implemented by one or more circuit(s), programmable processors), application specific integrated circuit(s) (ASIC(s)), programmable logic device (s) (PLD(s)) and/or field programmable logic device(s) (FPLD(s)), etc. When any of the apparatus or system claims of this patent are read to cover a purely software and/or firmware implementation, at least one of the example checkpoint processor 310, the example memory reader 320, and/or the example memory writer 330 are hereby expressly defined to include a tangible computer-readable medium such as a memory, DVD, CD, Blu-ray, etc. storing the software and/or firmware. Further still, the example memory controller 305 of FIG. 3 may include one or more elements, processes and/or devices in addition to, or instead of, those illustrated in FIG. 3, and/or may include more than one of any or all of the illustrated elements, processes and devices.

Figure 9:
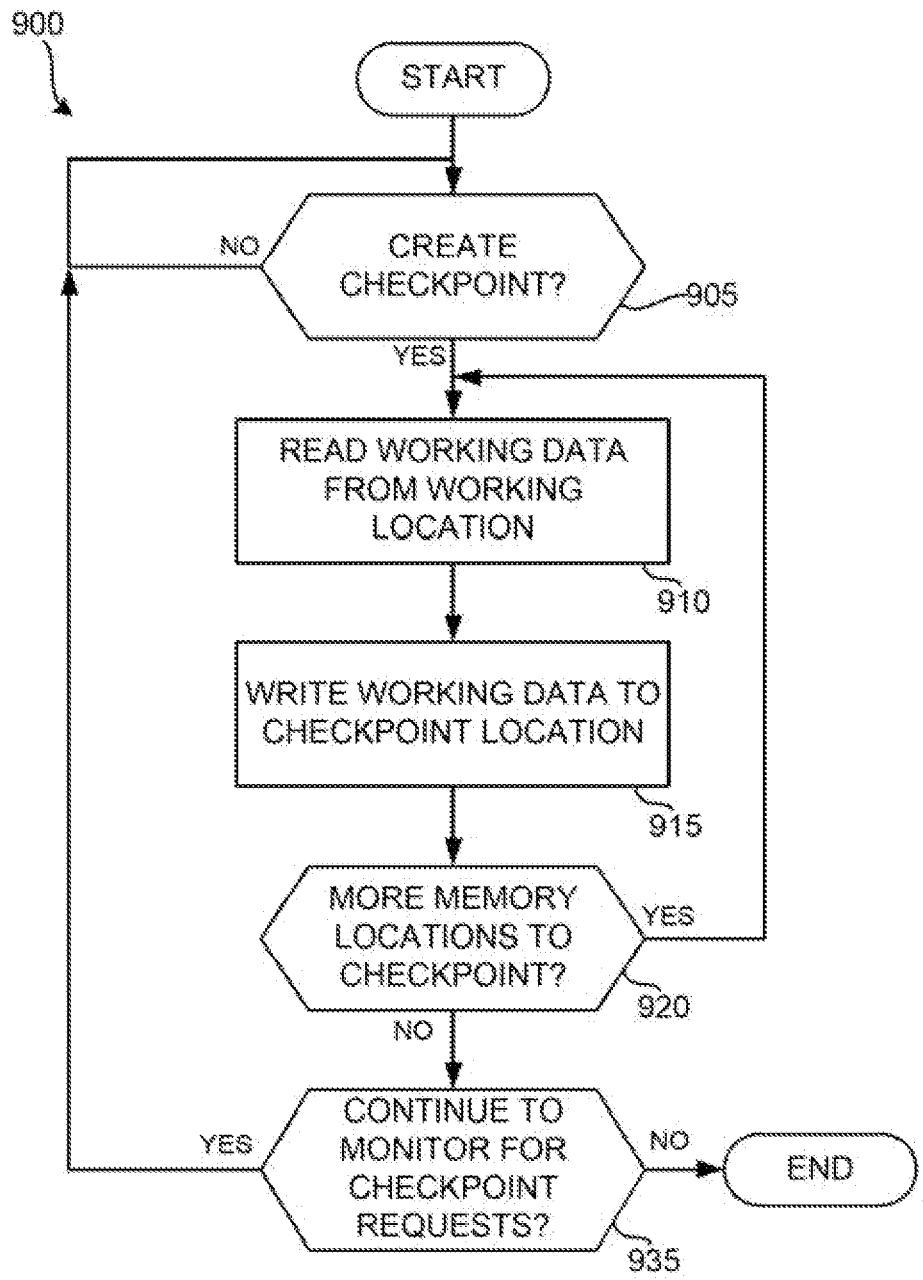
FIG. 9 is a flowchart representative of example machine-readable instructions that may be executed to implement the example memory controller of FIG. 3 to perform a checkpoint operation.
Figure 10:
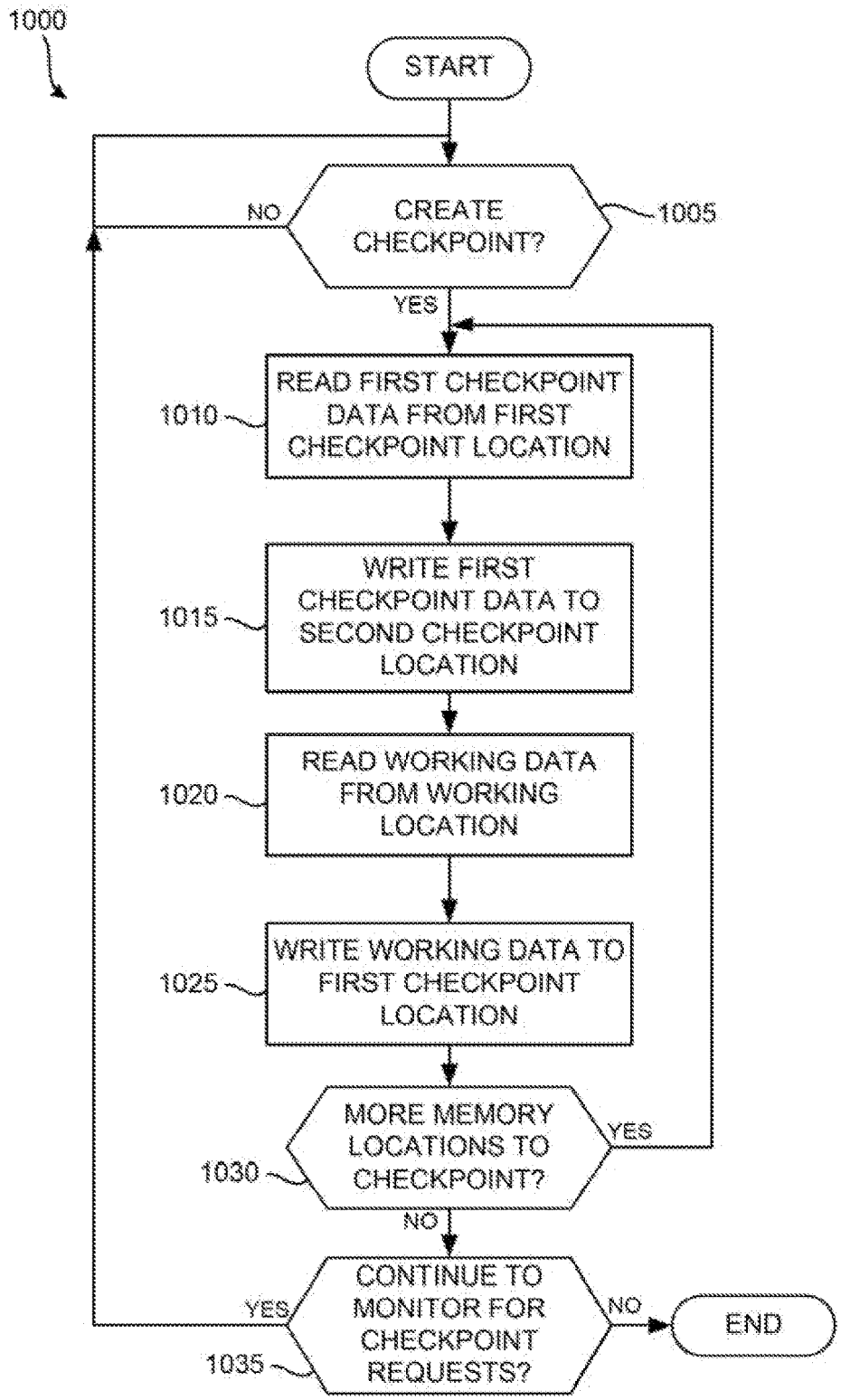
FIG. 10 is a flowchart representative of example machine-readable instructions that may be executed to implement the example memory controller of FIG. 3 to perform a checkpoint operation.

Flowcharts representative of example machine-readable instructions for implementing the memory controller 305 of FIG. 3 are shown in FIGS. 9, 10, and/or 11. In these examples, the machine-readable instructions comprise one or more program(s) for execution by a processor such as the processor 1212 shown in the example processor platform 1200 discussed below in connection with FIG. 12. The program may be embodied in software stored on a computer-readable storage medium such as a CD-ROM, a floppy disk, a hard drive, a digital versatile disk (DVD), a Blu-ray disk, or a memory associated with the processor 1212, but the entire program and/or parts thereof could alternatively be executed by a device other than the processor 1212 and/or embodied in firmware or dedicated hardware. Further, although the example program is described with reference to the flowcharts illustrated in FIGS. 9, 10, and/or 11, many other methods of implementing the example memory controller 305 may additionally or alternatively be used. For example, the order of execution of the blocks may be changed, and/or some of the blocks described may be changed, eliminated, or combined.

As mentioned above, the example processes of FIGS. 9, 10, and/or 11 may be implemented using coded instructions (e.g., computer-readable instructions) stored on a tangible computer-readable medium (e.g., a tangible computer-readable storage medium) such as a hard disk drive, a flash memory, a read-only memory (ROM), a compact disk (CD), a digital versatile-disk (DVD), a cache, a random-access memory (RAM) and/or any other storage media in which information is stored for any duration (e.g., for extended time periods, permanently, brief instances, for temporarily buffering, and/or for caching of the information). As used herein, the term tangible computer-readable medium is expressly defined to include any type of computer-readable storage medium and to exclude propagating signals. Additionally or alternatively, the example processes of FIGS. 9, 10, and/or 11 may be implemented using coded instructions (e.g., computer-readable instructions) stored on a non-transitory computer-readable medium such as a hard disk drive, a flash memory, a read-only memory, a compact disk, a digital versatile disk, a cache, a random-access memory and/or any other storage media in which information is stored for any duration (e.g., for extended time periods, permanently, brief instances, for temporarily buffering, and/or for caching of the information). As used herein, the term non-transitory computer-readable medium is expressly defined to include any type of computer-readable medium and to exclude propagating signals. As used herein, when the phrase "at least" is used as the transition term in a preamble of a claim, it is open-ended in the same manner as the term "comprising" is open ended. Thus, a claim using "at least" as the transition term in its preamble may include elements in addition to those expressly recited in the claim.

FIG. 9 is a flowchart representative of example machine-readable instructions 900 that may be executed to implement the example memory controller 305 of FIG. 3 to perform a checkpoint operation. The illustrated example of FIG. 9 depicts example machine-readable instructions 900 that may be used when a single checkpoint state is stored in the multi-level cell (e.g., the multi-level cell 400 of FIG. 4, the multi-level cell 500 of FIG. 5, the multi-level cell 800 of FIG. 8). As described in connection with FIG. 10, the example machine-readable instructions 900 of FIG. 9 may be supplemented with additional instructions to accommodate mull-level-cells that store multiple checkpoint states.

The example method of FIG. 9 begins at block 905. In the illustrated example, prior to block 905 working mode operations occur during which one or more working state transitions (e.g., one or more of the working state transitions 450, 455, 550, 555, and/or 830 of FIGS. 4, 5, and/or 8) are performed. During the working mode operations, the memory controller 305 causes the multi-level cell 400, 500, and/or 800 to transition between different states while ensuring that the checkpoint bit $b_0$ 410 of FIGS. 4 and/or 5, and/or the checkpoint bit group $b_1b_0$ 810 of FIG. 8 represent the same value as prior to the working data transition (e.g., the checkpoint bit(s) and/or the checkpoint bit group(s) are unchanged.

Turning now in detail to the illustrated example of FIG. 9, the checkpoint processor 310 determines whether a checkpoint should be created (block 905). In the illustrated example, a checkpoint is created in response to a received checkpoint request. In some examples, the checkpoint processor 310 receives a request to create a checkpoint from an application that requests a read and/or a write. Additionally or alternatively, any other periodic and/or aperiodic approach to triggering creation of a checkpoint may be used. For example, the checkpoint processor 310 may create the checkpoint after every read and/or write operation, the checkpoint processor 310 may create the checkpoint at time intervals (e.g., one minute, fifteen minutes, one hour, etc.).

If the checkpoint processor 310 is not to create a checkpoint, control returns to block 905 where the checkpoint processor 310 continues to determine whether a checkpoint should be created. When, the checkpoint processor 310 is to create a checkpoint (block 905), the memory reader 320 reads data stored in a working location (e.g., a working bit $b_1$ 405 of FIGS. 4 and/or 5, a working bit group $b_3b_2$ 805 of FIG. 8, etc.) of the multi-level cell (block 910). The memory writer 330 writes the data read from the working location of the multi-level cell to a checkpoint location (e.g., a checkpoint bit $b_0$ 410 of FIGS. 4 and/or 5, a checkpoint bit group $b_1b_0$ 810 of FIG. 8, etc.) (block 915). The checkpoint processor 310 then determines if there are additional multi-level cells to be checkpointed (block 920). If additional multi-level cells are to be checkpointed, control returns to block 910 where the additional multi-level cells are checkpointed. If there are no additional multi-level cells to checkpoint, the memory controller 305 determines whether it should continue to monitor for checkpoint requests (block 935). If the memory controller 305 determines that it should continue to monitor for checkpoint requests (block 935), control returns to block 905 where the checkpoint processor 310 determines when another checkpoint should be created. Otherwise, the example method of FIG. 10 ends.

FIG. 10 is a flowchart representative of example machine-readable instructions 1000 that may be executed to implement the example memory controller 305 of FIG. 3 to perform a checkpoint operation. The illustrated example of FIG. 10 depicts example machine-readable instructions 1000 that may be used when multiple checkpoint states are stored in the multi-level cell (e.g., the multi-level cell 600 of FIG. 6, the multi-level cell 700 of FIG. 7, etc.).

The example procedure of FIG. 10 begins at block 1005. In the illustrated example, prior to block 1005, working mode operations occur during which one or more working state transitions (e.g., one or more of the working state transitions 630 and/or 730 of FIGS. 6 and/or 7) are performed. During the working mode operations, the memory controller 305 causes the multi-level cell 600 and/or 700 to transition between different states while ensuring that the checkpoint bits $b_0$ 615, $b_1$ 610, $b_0$ 720, $b_1$ 715, and/or $b_2$ 710 of FIGS. 6 and/or 7 represent the same value as prior to the working data transition.

Turning now in detail to the illustrated example of FIG. 10, the checkpoint processor 310 determines whether a checkpoint should be created (block 1005). In the illustrated example, a checkpoint is created in response to a received checkpoint request. In some examples, the checkpoint processor 310 receives a request to create a checkpoint from an application that requests a read and/or a write. Additionally or alternatively, any other periodic and/or aperiodic approach to triggering creation of a checkpoint may be used. For example, the checkpoint processor 310 may create the checkpoint after every read and/or write operation, the checkpoint processor 310 may create the checkpoint at time intervals (e.g., one minute, fifteen minutes, one hour, etc.).

If the checkpoint processor 310 is not to create a checkpoint (block 1005), control returns to block 1005 where the checkpoint processor 310 continues to determine whether a checkpoint should be created. When the checkpoint processor 310 is to create a checkpoint (block 1005), the memory reader 320 reads a first checkpoint datum stored in a first checkpoint location (e.g., the checkpoint bit $b_1$ 610, the checkpoint bit $b_2$ 710, etc.) (block 1010). The first checkpoint datum is then stored in a second checkpoint location (e.g., the checkpoint bit $b_0$ 615, the checkpoint bit $b_1$ 715, etc.) of the multi-level cell (block 1015) by the memory writer 330. The memory reader 320 then reads a working datum from a working location (e.g., the working bit $b_2$ 605, the working bit $b_3$ 705, etc.). The memory writer 330 writes the working datum to the first checkpoint location (e.g., the checkpoint bit $b_1$ 610, the checkpoint bit $b_2$ 710, etc.) (block 1025). The checkpoint processor 310 determines if there are additional multilevel cells to be checkpointed (block 1030). If additional multi-level cells are to be checkpointed, control returns to block 1010 where the additional multi-level cells are checkpointed. If there are no additional multi-level cells to checkpoint, the memory controller 305 determines whether it should continue to monitor for checkpoint requests (block 1035). If the memory controller 305 determines that it should continue to monitor for checkpoint requests (block 1035), control returns to block 1005 where the checkpoint processor determines when a checkpoint should be created. Otherwise, the example method of FIG. 10 ends.

Figure 11:
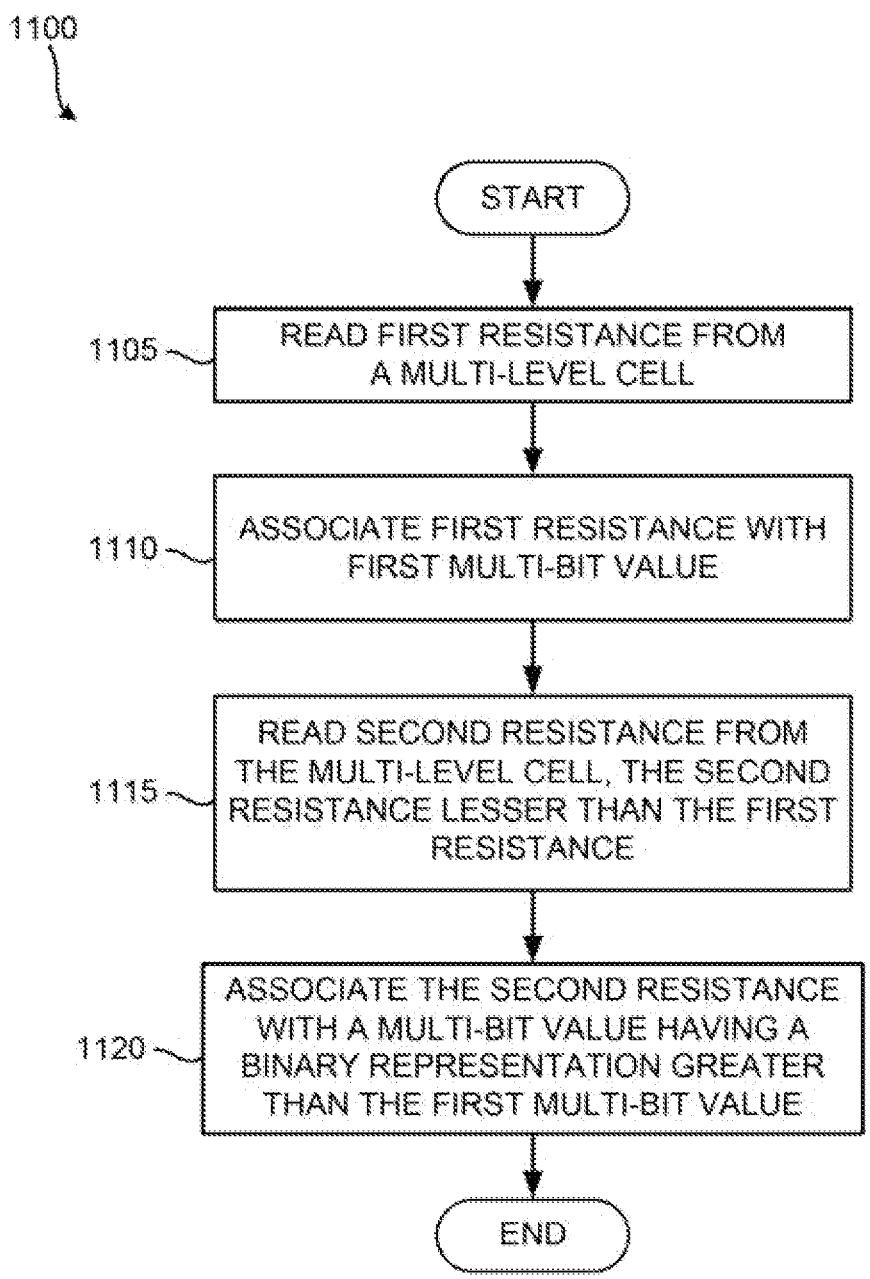
FIG. 11 is a flowchart representative of example machine-readable instructions that may be executed to implement the example memory controller of FIG. 3 to perform a resistance encoding.

FIG. 11 is a flowchart representative of example machine-readable instructions 1100 that may be executed to implement the example memory controller 305 of FIG. 3 to perform a resistance encoding. The example procedure of FIG. 11 begins at block 1105 when the memory reader 320 reads a first resistance from a multi-level cell (e.g., the multi-level-cell 500 of FIG. 5, the multi-level cell 600 of FIG. 6, the multi-level cell 700 of FIG. 7, the multi-level cell 800 of FIG. 8, etc.) (block 1105). The checkpoint processor 310 associates the first resistance with a first multi-bit value (block 1110). In the illustrated example, the first multi-bit value (e.g., the multi-bit value represented by state $S_2$ 530 of FIG. 5) represents multiple layers-of the multi-level cell. The memory reader 320 reads a second resistance from the multi-level cell (block 1115). In the illustrated example, the second resistance is lesser than the first resistance. The checkpoint processor 310 associates the second resistance with a second multi-bit value (e.g., the multi-bit value represented by state $S_3$ 535 of FIG. 5) having a binary representation greater than the first multi-bit value (block 1120). In some examples, the second resistance is greater than the first resistance and the binary representation of the first resistance is lesser than the binary representation of the first multi-bit value.

Figure 12:
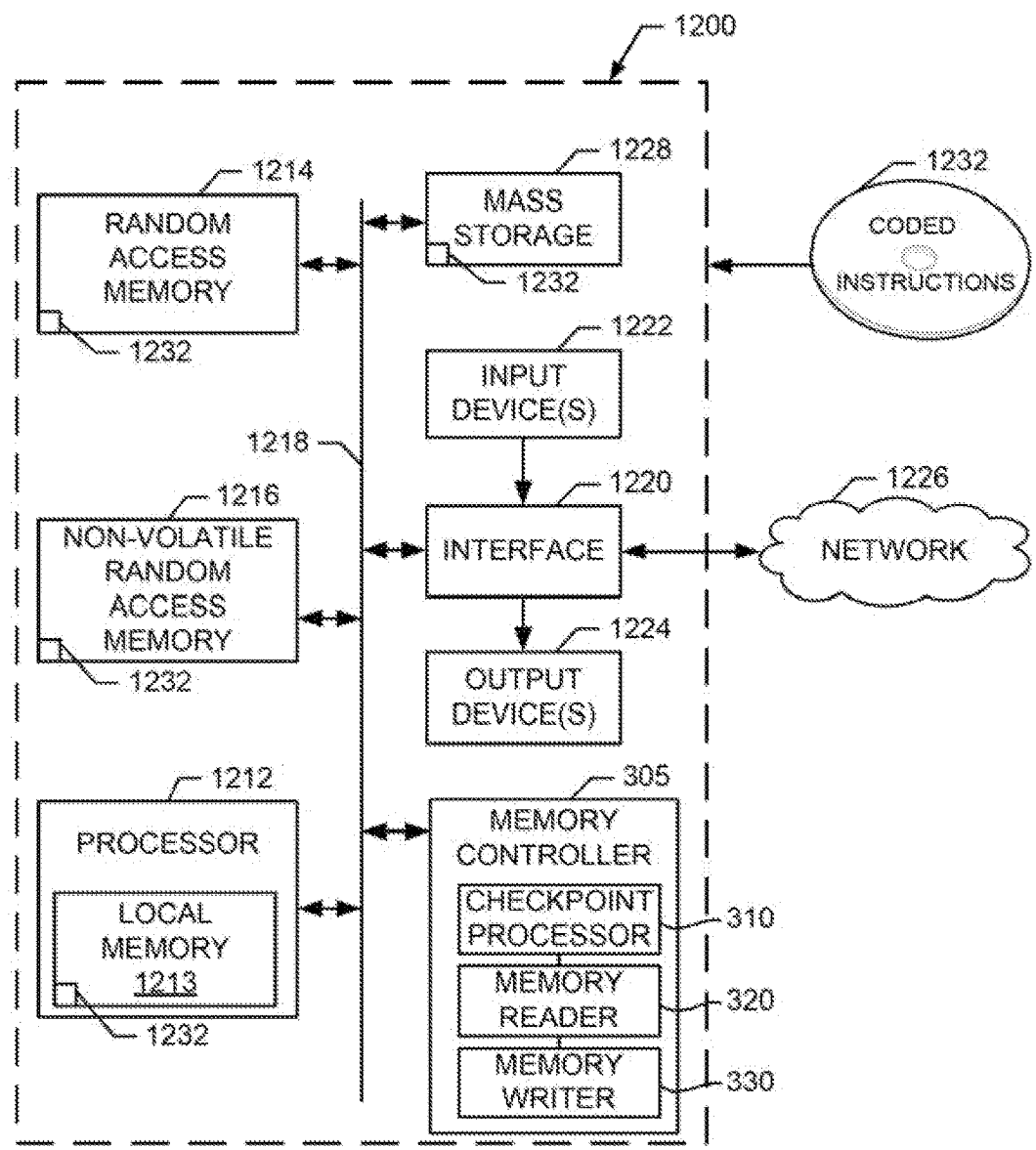
FIG. 12 is a block diagram of an example processor platform capable of executing the example machine-readable instructions of FIGS. 9, 10, and/or 11 to implement the example memory controller of FIG. 3.

FIG. 12 is a block diagram of an example processor platform 1200 capable of executing the example machine-readable instructions of FIGS. 9, 10, and 11 to implement the example memory controller of FIG. 3. The processor platform 1200 can be, for example, a server, a personal computer, a mobile phone (e.g., a cell phone), a personal digital assistant (PDA), an Internet appliance, or any other type of computing device.

The system 1200 of the instant example includes a processor 1212. For example, the processor 1212 can be implemented by one or more microprocessors or controllers from any desired family or manufacturer.

The processor 1212 includes a local memory 1213 (e.g., a cache) and is in communication with a main memory including a volatile memory 1214 and a nonvolatile memory 1216 via a bus 1218. The volatile memory 1214 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1216 of the illustrated example is implemented by multi-level cell (MLC) non-volatile random access memory (NVRAM). However, the non-volatile memory 1216 may be implemented by any other desired type of memory device (e.g., flash memory, phase-change memory (PCRAM), memristors, etc.). Access to the main memory 1214, 1216 is controlled by the memory controller 305. In the illustrated example, the memory controller 305 includes the checkpoint processor 310, the memory reader 320, and the memory writer 330 as described in connection with FIG. 3.

The processor platform 1200 also includes an interface circuit 1220. The interface circuit 1220 may be implemented by any type of interface standard, such as an Ethernet interface, a universal serial bus (USB), and/or a PCI express interface.

One or more input devices 1222 are connected to the interface circuit 1220. The input device(s) 1222 permit a user to enter data and commands into the processor 1212. The input device(s) can be implemented by, for example, a keyboard, a mouse, a touchscreen, a track-pad, a trackball, isopoint and/or a voice recognition system.

One or more output devices 1224 are also connected to the interface circuit 1220. The output devices 1224 can be implemented, for example, by display devices (e.g., a liquid crystal display, a cathode ray tube display (CRT), a printer and/or speakers). The interface circuit 1220, thus, typically includes a graphics driver card.

The interface circuit 1220 also includes a communication device such as a modem or network interface card to facilitate exchange of data with external computers via a network 1226 (e.g., an Ethernet connection, a digital subscriber line (DSL), a telephone line, coaxial cable, a cellular telephone system, etc.).

The processor platform 1200 also includes one or more mass storage devices 1228 for storing software and data. Examples of such mass storage devices 1228 include floppy disk drives, hard drive disks, compact disk drives, and digital versatile disk (DVD) drives.

The coded instructions 1232 of FIGS. 9, 10, and/or 11 may be stored in the mass storage device 1228. In the volatile memory 1214, in the non-volatile memory 1216, in the local memory 1213, and/or on a re movable storage medium such as a CD or DVD.

From the foregoing, it will be appreciated that disclosed methods, apparatus and articles of manufacture enable local checkpointing using multi-level (MLC) non-volatile random access memory (NVRAM). Advantageously, the checkpointing uses less time and energy than traditional checkpointing systems. As such, checkpointing is fast, atomic, and enables consistent data management in NVRAM.

Although certain example methods, apparatus, and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method of local checkpointing using a multi-level cell, the method comprising:
   storing a first datum in a first level of a multi-level cell;
   storing a second datum in a second level of the same multi-level cell, the second datum representing a checkpoint of the first datum;
   copying the first datum from the first level to the second level of the multi-level cell to create the checkpoint and implement a versioned memory; and
   during a checkpointing operation, altering resistance encodings of the multi-level cell to reduce the time and energy used to create the checkpoint.

2. The method as described in claim 1, wherein copying the first datum from the first level to the second level comprises transitioning from a first data state to a second data state.

3. The method as described in claim 2, wherein the first data state is represented by a first physical property value of the multi-level cell and the second data state is represented by a second physical property value of the multi-level cell, wherein the physical property values are at least one of a resistance value, a capacitance value, and an atomic spin value.

4. The method as described in claim 3, wherein the first data state represents a first binary value and the second data state represents a second binary value, the first binary value greater than or equal to the second binary value.

5. The method as described in claim 4, wherein the first physical property value is less than or equal to the second physical property value.

6. The method as described in claim 1, further comprising reading the first datum in response to a read request.

7. The method as described in claim 6, wherein the second datum is not read in response to the read request.

8. The method as described in claim 1, wherein the first datum is a single bit.

9. An apparatus to implement local checkpointing in a multi-level cell, the apparatus comprising:
    a checkpoint processor to create a checkpoint of a first datum stored in a first level of the multi-level cell, the checkpoint stored in a second level of the same multi-level cell to implement a versioned memory and during a checkpointing operation, alter resistance encodings of the multi-level cell to reduce the time and energy used to create the checkpoint;
    a memory reader to read data stored in the multi-level cell;
    a memory writer to write data to the multi-level cell.

10. The apparatus as described in claim 9, wherein the memory reader is to read data from the first level of the multi-level cell in response to a read request.

11. The apparatus as described in claim 10, wherein the memory reader does not read data from the second level of the multi-level cell in response to the read request.

12. A non-transitory machine-readable storage medium comprising instructions which, when executed, cause a machine to at least:
    store a first datum in a first level of a multi-level cell of a non-volatile random access memory (NVRAM);
    store a second datum in a second level of the same multi-level cell, the second datum representing a checkpoint of the first datum;
    copy the first datum from the first level to the second level of the multi-level cell to create the checkpoint and implement a versioned memory and
    during a checkpointing operation, alter resistance encodings of the multi-level cell to reduce the time and energy used to create the checkpoint.

13. The non-transitory machine-readable storage medium as described in claim 12, wherein copying the first datum from the first level to the second level comprises transitioning from a first data state to a second data state.

14. The non-transitory machine-readable storage medium as described in claim 13, wherein:
    the first data state is represented by a first physical property value of the multi-level cell, the first data state representing a first binary value; and
    the second data state is represented by a second physical property value of the multi-level cell, the second data state representing a second binary value, wherein the physical property values are at least one of a resistance value, a capacitance value, and an atomic spin value.

15. The non-transitory machine-readable storage medium as described in claim 14, wherein
    the first binary value is greater than or equal to the second binary value; and
    the first physical property value is less than or equal to the second physical property value.

* * * * *